(12) United States Patent
Yuzawa et al.

(10) Patent No.: US 7,560,814 B2
(45) Date of Patent: *Jul. 14, 2009

(54) SEMICONDUCTOR DEVICE THAT IMPROVES ELECTRICAL CONNECTION RELIABILITY

(75) Inventors: Takeshi Yuzawa, Chino (JP); Hideki Yuzawa, Iida (JP); Michiyoshi Takano, Okaya (JP)

(73) Assignee: Seiko Epson Corporation, Tokyo (JP)

(*) Notice: Subject to any disclaimer, the term of this patent is extended or adjusted under 35 U.S.C. 154(b) by 18 days.

This patent is subject to a terminal disclaimer.

(21) Appl. No.: 11/797,476

(22) Filed: May 3, 2007

(65) Prior Publication Data

US 2007/0228560 A1  Oct. 4, 2007

Related U.S. Application Data

(63) Continuation of application No. 11/142,324, filed on Jun. 2, 2005, now Pat. No. 7,230,338.

(30) Foreign Application Priority Data

Jun. 4, 2004  (JP) ............................. 2004-167194

(51) Int. Cl.
  H01L 29/40 (2006.01)
  H01L 23/48 (2006.01)
  H01L 23/52 (2006.01)
  H01L 23/485 (2006.01)
(52) U.S. Cl. .......... 257/734; 257/E23.02; 257/E23.021; 257/E23.129; 257/E29.111; 257/E23.144; 257/E23.187; 257/E23.145; 257/E23.16; 257/E23.151; 257/503; 257/758; 257/774; 257/784; 257/776; 257/751; 257/762; 257/642

(58) Field of Classification Search .................. 257/734, 257/758, E23.02, E23.021, E23.129, E29.111, 257/E23.144, E23.187, E25.145, E23.16, 257/E23.151, 503, 762, 642, 774, 751, 776, 257/784
See application file for complete search history.

(56) References Cited

U.S. PATENT DOCUMENTS 5,202,275 A    4/1993  Sugiura et al.
6,150,725 A *  11/2000 Misawa et al. ............... 257/781
6,689,680 B2   2/2004  Greer (Continued)

FOREIGN PATENT DOCUMENTS

JP    A-64-069035    3/1989

(Continued)

*Primary Examiner*—Alexander O Williams
(74) *Attorney, Agent, or Firm*—Oliff & Berridge, PLC

(57) ABSTRACT

A semiconductor device including: a semiconductor section in which an element is formed; an insulating layer formed on the semiconductor section; an electrode pad formed on the insulating layer; a contact section formed of a conductive material provided in a contact hole in the insulating layer and electrically connected with the electrode pad; a passivation film formed to have an opening on a first section of the electrode pad and to be positioned on a second section of the electrode pad; a bump formed to be larger than the opening in the passivation film and to be partially positioned on the passivation film; and a barrier layer which lies between the electrode pad and the bump. The contact section is connected with the second section at a position within a range in which the contact section overlaps the bump while avoiding the first section of the electrode pad.

12 Claims, 4 Drawing Sheets

U.S. PATENT DOCUMENTS

| | | |
|---|---|---|
| 6,727,593 B2 | 4/2004 | Toyoda et al. |
| 6,873,053 B2 * | 3/2005 | Hino et al. .................. 257/774 |
| 7,230,338 B2 * | 6/2007 | Yuzawa et al. .............. 257/758 |
| 2001/0045651 A1 | 11/2001 | Saito et al. |
| 2002/0000665 A1 | 1/2002 | Barr et al. |
| 2002/0163083 A1 | 11/2002 | Hatano et al. |
| 2002/0171117 A1 | 11/2002 | Solo De Zaldivar |
| 2003/0011072 A1 | 1/2003 | Shinogi et al. |
| 2003/0230809 A1 | 12/2003 | Nakajima et al. |
| 2004/0070042 A1 | 4/2004 | Lee et al. |
| 2004/0094837 A1 | 5/2004 | Greer |
| 2004/0145031 A1 | 7/2004 | Ito |
| 2004/0188847 A1 | 9/2004 | Nozawa et al. |
| 2005/0006688 A1 | 1/2005 | Solo De Zaldivar |
| 2005/0093150 A1 | 5/2005 | Nakatani |
| 2005/0202221 A1 | 9/2005 | Wang et al. |
| 2005/0224984 A1 | 10/2005 | Hortaleza et al. |
| 2005/0272243 A1 | 12/2005 | Yuzawa et al. |
| 2006/0131759 A1 | 6/2006 | Hung et al. |

FOREIGN PATENT DOCUMENTS

| | | |
|---|---|---|
| JP | A-09-283525 | 10/1997 |
| JP | A-2001-176966 | 6/2001 |

* cited by examiner

US 7,560,814 B2

SEMICONDUCTOR DEVICE THAT IMPROVES ELECTRICAL CONNECTION RELIABILITY

This is a Continuation of application Ser. No. 11/142,324, filed Jun. 2, 2005, now U.S. Pat. No. 7,230,338, which is related to U.S. application Ser. No. 11/142,439 and claims priority to Japanese Patent Application No. 2004-167194, filed on Jun. 4, 2004. The disclosure of the prior application is hereby incorporated by reference herein in its entirety.

BACKGROUND OF THE INVENTION

The present invention relates to a semiconductor device, a circuit board, and an electronic instrument.

In order to reduce the planar area of a semiconductor chip, it is known that a bump as an external electrode is caused to overlap a formation region of elements (transistor) (see Japanese Patent Application Laid-open No. 9-283525). An interconnect layer and an electrode pad above the interconnect layer are formed through an insulating layer on the formation region of the elements. The interconnect layer and the electrode pad are electrically connected through a contact section embedded in the insulating layer. A part of the electrode pad is open from a passivation film, and a part of the bump overlaps the opening. A barrier layer lies between the electrode pad and the bump in order to prevent diffusion between the electrode pad and the bump.

However, even if the barrier layer lies between the electrode pad and the bump, it is difficult to completely prevent diffusion between the electrode pad and the bump inside the opening in the passivation film depending on the thickness of the barrier layer and other conditions. In a related-art structure, since the contact section is connected with the electrode pad inside the opening in the passivation film, electrical connection reliability near the contact section may deteriorate if diffusion occurs to even only a small extent.

The thickness of the barrier layer is usually about 2000 to 5000 angstroms. If the thickness of the barrier layer is increased in order to prevent deterioration of the barrier performance, cost is increased. Therefore, it is desirable to increase the barrier performance without increasing the thickness of the barrier layer.

SUMMARY

According to a first aspect of the invention, there is provided a semiconductor device, comprising:
 a semiconductor section in which an element is formed;
 an insulating layer formed above the semiconductor section;
 an electrode pad formed on the insulating layer;
 a contact section formed of a conductive material provided in a contact hole in the insulating layer and electrically connected with the electrode pad;
 a passivation film formed to have an opening on a first section of the electrode pad and to be positioned on a second section of the electrode pad;
 a bump formed to be larger than the opening in the passivation film and to be partially positioned on the passivation film; and
 a barrier layer which lies between the electrode pad and the bump,
 wherein the contact section is connected with the second section at a position within a range in which the contact section overlaps the bump while avoiding the first section of the electrode pad.

According to a second aspect of the invention, there is provided a circuit board on which is mounted the above-described semiconductor device.

According to a third aspect of the invention, there is provided an electronic instrument comprising the above-described semiconductor device.

DETAILED DESCRIPTION OF EMBODIMENTS

Figure 1:
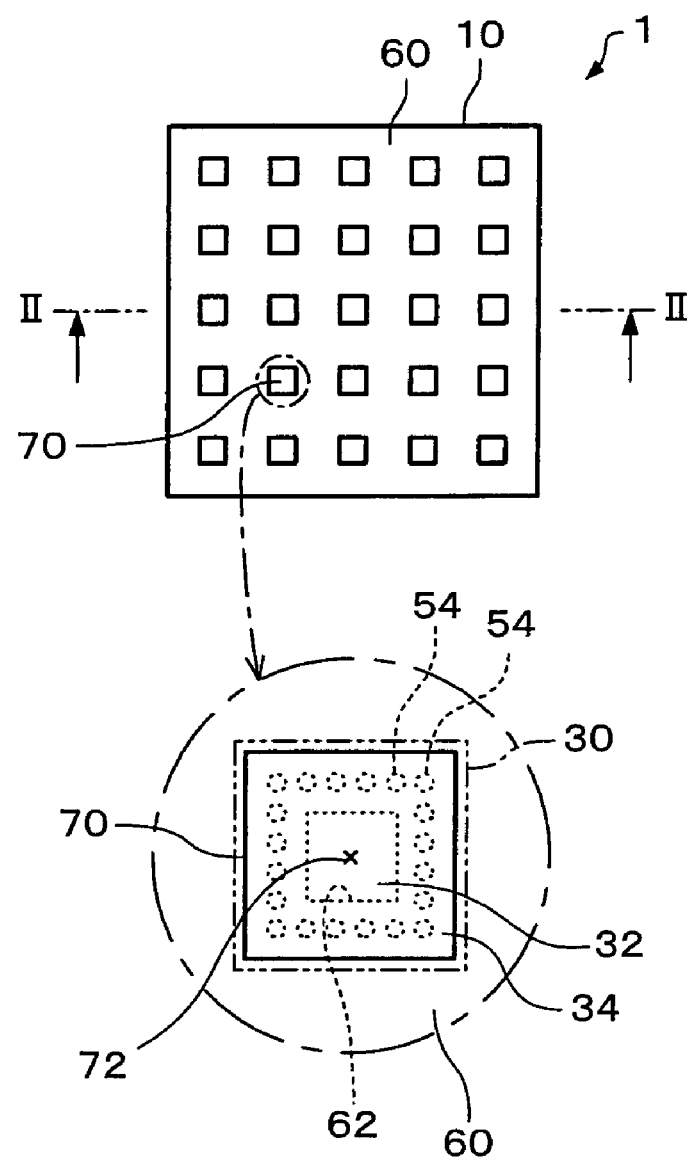
FIG. 1 is a plan view showing a semiconductor device according to an embodiment of the invention.

The invention can improve electrical connection reliability.

(1) According to one embodiment of the present invention, there is provided a semiconductor device, comprising:
 a semiconductor section in which an element is formed;
 an insulating layer formed above the semiconductor section;
 an electrode pad formed on the insulating layer;
 a contact section formed of a conductive material provided in a contact hole in the insulating layer and electrically connected with the electrode pad;
 a passivation film formed to have an opening on a first section of the electrode pad and to be positioned on a second section of the electrode pad;
 a bump formed to be larger than the opening in the passivation film and to be partially positioned on the passivation film; and
 a barrier layer which lies between the electrode pad and the bump,
 wherein the contact section is connected with the second section at a position within a range in which the contact section overlaps the bump while avoiding the first section of the electrode pad.

In this embodiment, the contact section is connected with the second section of the electrode pad. Since the passivation film lies between the second section of the electrode pad and the bump, diffusion from the bump into the second section rarely occurs in comparison with the first section exposed from the passivation film. This prevents occurrence of damage near the contact section due to diffusion from the bump. Therefore, electrical connection reliability can be improved.

(2) In this semiconductor device,
 the bump may overlap a region in which the element is formed in the semiconductor section.

(3) In this semiconductor device,
 a part of the barrier layer may be formed to be positioned on the passivation film; and
 the passivation film and the barrier layer may lie between the second section of the electrode pad and the bump.

According to this feature, the barrier layer lies between the second section and the bump in addition to the passivation film. Therefore, diffusion can be more effectively prevented.

(4) The semiconductor device may further comprise:

an interconnect layer formed between the semiconductor section and the electrode pad, wherein the interconnect layer is electrically connected with the element; and wherein the contact section lies between the interconnect layer and the electrode pad.

(5) In this semiconductor device, a depression may be formed on a surface of the electrode pad at a position at which the electrode pad overlaps the contact section.

According to this feature, since the contact section is not connected with the first section of the electrode pad, even if the thickness of the barrier layer on the electrode pad is decreased to follow the depression, diffusion between the electrode pad and the bump can be uniformly prevented since the passivation film is formed between the bump and the electrode pad.

(6) The semiconductor device may comprise:

a plurality of the contact sections, wherein the contact sections are symmetrically arranged around a center axis of the bump.

(7) According to one embodiment of the invention, there is provided a circuit board on which is mounted the above-described semiconductor device.

(8) According to one embodiment of the invention, there is provided an electronic instrument comprising the above-described semiconductor device.

An embodiment of the invention is described below with reference to the drawings.

Figure 2:
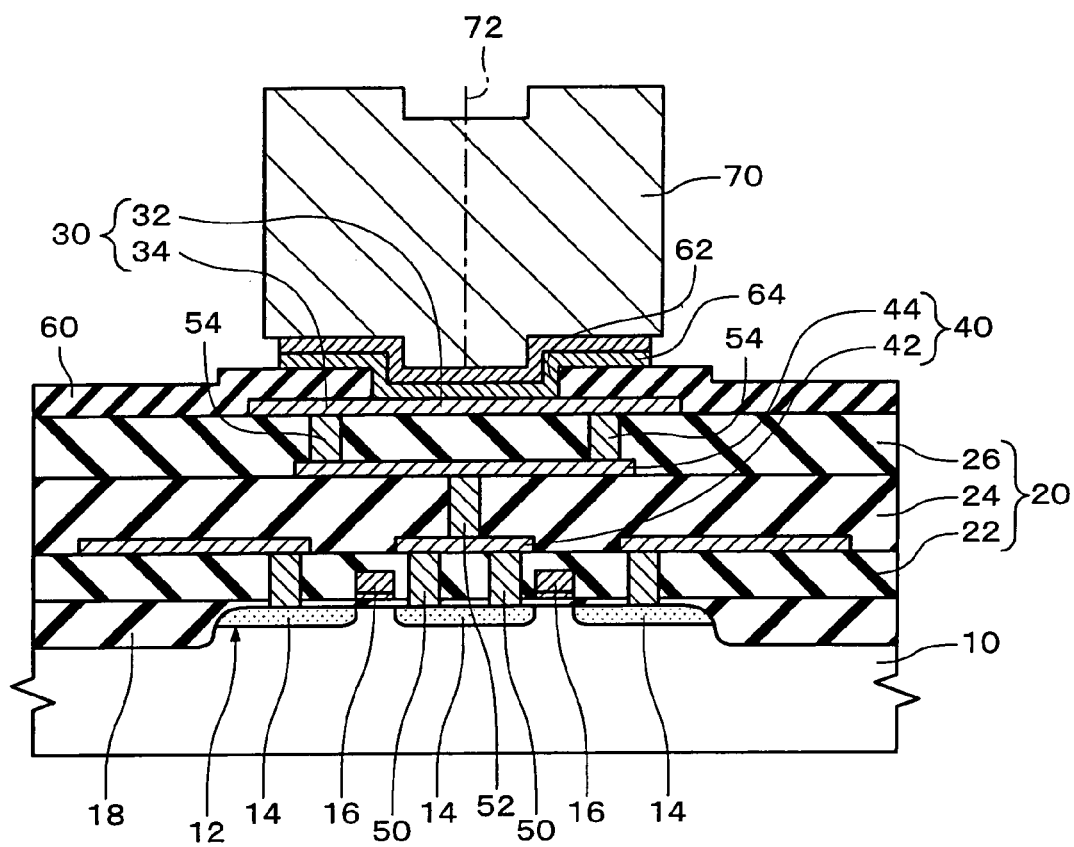
FIG. 2 is a partially enlarged sectional view taken along the line II-II shown in FIG. 1.

FIG. 1 is a plan view showing a semiconductor device according to an embodiment of the invention, and FIG. 2 is a partially enlarged sectional view taken along the line II-II shown in FIG. 1.

The semiconductor device according to this embodiment may be a semiconductor chip (bare chip) (see FIG. 1), or may be a semiconductor wafer before being cut into semiconductor chips, or may be a package such as a chip size package (CSP).

A semiconductor device 1 includes a semiconductor section (semiconductor substrate, for example) 10. A part or the entirety of the semiconductor section 10 is formed of a semiconductor (silicon, for example). A plurality of elements 12 are formed in the semiconductor section 10. Each of the elements 12 makes up a transistor (MOS transistor, for example). As shown in FIG. 2, the elements 12 include a diffusion region (source or drain) 14 formed in the surface area of the semiconductor section 10, and an electrode (gate) 16 formed on the semiconductor section 10. A well of a different conductivity type may be formed in the surface area of the semiconductor section 10, and the diffusion region 14 may be formed in the well. The region of the elements 12 is called an active region. An element-isolation electrical insulating film (oxide film formed by a local-oxidation-of-silicon (LOCOS) method, for example) 18 is formed in the region (inactive region) of the semiconductor section 10 other than the elements 12.

An insulating layer 20 including one or more layers (first to third insulating layers 22, 24, and 26, for example) is formed on the semiconductor section 10. The insulating layer 20 may be formed of an oxide film (silicon oxide film, for example). An electrode pad 30 electrically connected with the element 12 is formed on the outermost surface of the insulating layer 20. An interconnect layer 40 including one or more layers (first and second interconnect layers 42 and 44, for example) may lie between the semiconductor section 10 and the electrode pad 30. The interconnect layer 40 is electrically connected with the element 12. The interconnect layer 40 or the electrode pad 30 may be formed of a metal such as aluminum or copper.

In the example shown in FIG. 2, the first insulating layer 22 is formed on the semiconductor section 10, the first interconnect layer 42 is formed on the first insulating layer 22, and the element 12 (diffusion region 14, for example) and the first interconnect layer 42 are electrically connected through a contact section 50. The second insulating layer 24 is formed on the first interconnect layer 42, the second interconnect layer 44 is formed on the second insulating layer 24, and the first and second interconnect layers 42 and 44 are electrically connected through a contact section 52. The third insulating layer (uppermost insulating layer) 26 is formed on the second interconnect layer 42, the electrode pad 30 is formed on the third insulating layer 26, and the second interconnect layer 44 and the electrode pad 30 are electrically connected through a contact section 54. The interconnects can be routed while preventing an increase in the planar area by forming the interconnect layer to have a multilayer structure as described above.

The contact sections 50, 52, and 54 vertically pass through a part or the entirety of the insulating layer 20. Some or all of the contact sections 50, 52, and 54 may be formed of a conductive material such as a metal. Some or all of the contact sections 50, 52, and 54 may be formed of a material the same as or different from the material for the interconnect layer 40 or the electrode pad 30. As the formation method for the contact section, the insulating layer 20 may be formed by using a spin coating method, a chemical vapor deposition (CVD) method, or the like, a contact hole may be formed in the insulating layer 20 by etching, and a conductive material for the contact section may be deposited in the contact hole by applying a CVD method, for example. Then, the surface of the insulating layer 20 may be planarized by chemical mechanical polishing (CMP) or the like, and the electrode pad 30 or the interconnect layer 40 may be sputtered. In this case, as shown in FIG. 2, the surface of the electrode pad 30 or the interconnect layer 40 forms a flat surface corresponding to the underlayer surface. Or, the contact section and the electrode pad 30 (or interconnect layer 40) may be integrally formed by sputtering on the insulating layer 20 in which the contact hole is formed. In this case, a step of planarizing the surface of the electrode pad 30 may be performed after sputtering.

The interconnect layer may have a two-layer structure as described above, or may have a single-layer structure or a structure including three or more layers. Or, the interconnect layer may be omitted, and the element 12 (diffusion region 14) and the electrode pad 30 may be electrically connected directly through the (straight extending) contact section 54.

A passivation film 60 is formed on the outermost surface of the insulating layer 20. The passivation film 60 is formed to have an opening 62 on a first section 32 (center section, for example) of the electrode pad 30 and to be positioned on a second section 34 (end section which continuously encloses the center section, for example). For example, a plurality of openings 62 may be formed in the passivation film 60 so that one of the openings 62 is disposed on the center section of each of the electrode pads 30. The first section 32 of the electrode pad 30 is exposed from the opening 62 in the passivation film 60. The second section 34 of the electrode pad 30 is covered with the passivation film 60. The passivation film 60 may be formed of an oxide film, a nitride film, a polyimide resin, or the like.

A barrier layer (under-bump metal layer) 64 is formed on the electrode pad 30. The barrier layer 64 may be formed to include one or more layers. The barrier layer 64 may be formed by sputtering. The barrier layer 64 prevents diffusion between the electrode pad 30 and the bump 70 described later. The barrier layer 64 may further have a function of increasing adhesion between the electrode pad 30 and the bump 70. The barrier layer 64 may include a titanium tungsten (TiW) layer. In the case where the barrier layer 64 includes a plurality of layers, the outermost surface of the barrier layer 64 may be an electroplating feed metal layer (Au layer, for example) for depositing the bump 70.

The barrier layer 64 covers the entire area of the electrode pad 30 exposed from the passivation film 60 (first section 32). A part of the barrier layer 64 may also be formed above the second section 34 of the electrode pad 30 so that the barrier layer 64 is positioned on the passivation film 60. The barrier layer 64 is continuously formed from the first section 32 to the second section 34 of the electrode pad 30. As shown in FIG. 2, the barrier layer 64 may overlap a part or the entirety of the second section 34 of the electrode pad 30. The barrier layer 64 may overlap a region which continuously encloses the opening 62 in the passivation film 60.

The bump 70 is formed on the electrode pad 30 (barrier layer 64 in more detail). The bump 70 includes one or more layers of a metal such as gold, nickel, or copper. The bump 70 is formed to be larger than the opening 62 in the passivation film 60 and to be partially positioned on the passivation film 60. In other words, the bump 70 covers the entire opening 62 in the passivation film 60 and is also formed above the second section 34 of the electrode pad 30. The bump 70 is continuously formed from the first section 32 to the second section 34 of the electrode pad 30. As shown in FIG. 2, the bump 70 may overlap a part or the entirety of the second section 34 of the electrode pad 30. As shown in the partially enlarged view of FIG. 1, the bump 70 may overlap a region which continuously encloses the opening 62 in the passivation film 60. The barrier layer 64 lies between the electrode pad 30 and the bump 70.

In this embodiment, the contact section 54 is connected with the second section 34 at a position within the range in which the contact section 54 overlaps the bump 70 while avoiding the first section 32 of the electrode pad 30. The contact section 54 lies between the interconnect layer 40 (second interconnect layer 44 in FIG. 2) and the electrode pad 30. The entire connection region between the contact section 54 and the electrode pad 30 is disposed in the second section 34 of the electrode pad 30. According to this configuration, since the passivation film 60 lies between the second section 34 of the electrode pad 30 and the bump 70, diffusion from the bump 70 into the second section 34 rarely occurs in comparison with the first section 32 exposed from the passivation film 60. This prevents occurrence of damage near the contact section 54 due to diffusion from the bump 70. Therefore, electrical connection reliability can be improved. As shown in FIG. 2, in the case where the barrier layer 64 lies between the second section 34 of the electrode pad 30 and the bump 70 in addition to the passivation film 60, diffusion can be more effectively prevented.

The bump 70 (electrode pad 30) overlaps the formation region of the elements 12 in the semiconductor section 10. In more detail, a part or the entirety of the bump 70 overlaps a part or the entirety of the region (active region) of the elements 12. The bumps 70 (electrode pads 30) may be arranged on the plane of the semiconductor section 10 in an area array (in a plurality of rows and columns). In this embodiment, since the contact section 54 is connected with the electrode pad 30 at a position within the range in which the contact section 54 overlaps the bump 70 and the interconnects are not uselessly routed (routed toward the outside, for example), the electrical characteristics can be improved.

As shown in FIG. 2, a plurality of the contact sections 54 connected with the electrode pad 30 may be provided. All the contact sections 54 are connected with the second section 34 at positions within the range in which the contact section 54 overlaps the bump 70 while avoiding the first section 32 of the electrode pad 30. As shown in FIG. 1, the contact sections 54 are arranged to enclose the opening 62 in the passivation film 60 (first section 32 of the electrode pad 30), for example.

The contact sections 54 may be symmetrically arranged around a center axis (axis which passes through the center of the bump and is included in the plane when viewed from the upper surface of the bump) 72 of the bump 70. In more detail, one of the contact sections 54 is symmetrical with respect to another contact section 54 around the center axis 72 of the bump 70. The statement "symmetrically arranged around the center axis 72 of the bump 70" means that the contact sections 54 may be line-symmetrical around the center axis 72, or may be plane-symmetrical about a virtual plane including the center axis 72, or may be point-symmetrical around one point of the center axis 72. According to this configuration, since the contact sections 54 are symmetrically arranged, the mechanical stress applied through the bump 70 due to the packaging process or the like can be evenly dispersed. Therefore, occurrence of damage to the contact section 54 or the electrode pad 30 due to stress concentration can be prevented.

The contact sections 50 and 52 which are not connected with the electrode pad 30 may also be symmetrically arranged around the center axis 72 of the bump 70 in the same manner as the contact sections 54.

A method of manufacturing the semiconductor device according to this embodiment includes features which may be derived from the above description. The semiconductor device may be manufactured by applying a known method to other details.

Figure 3:
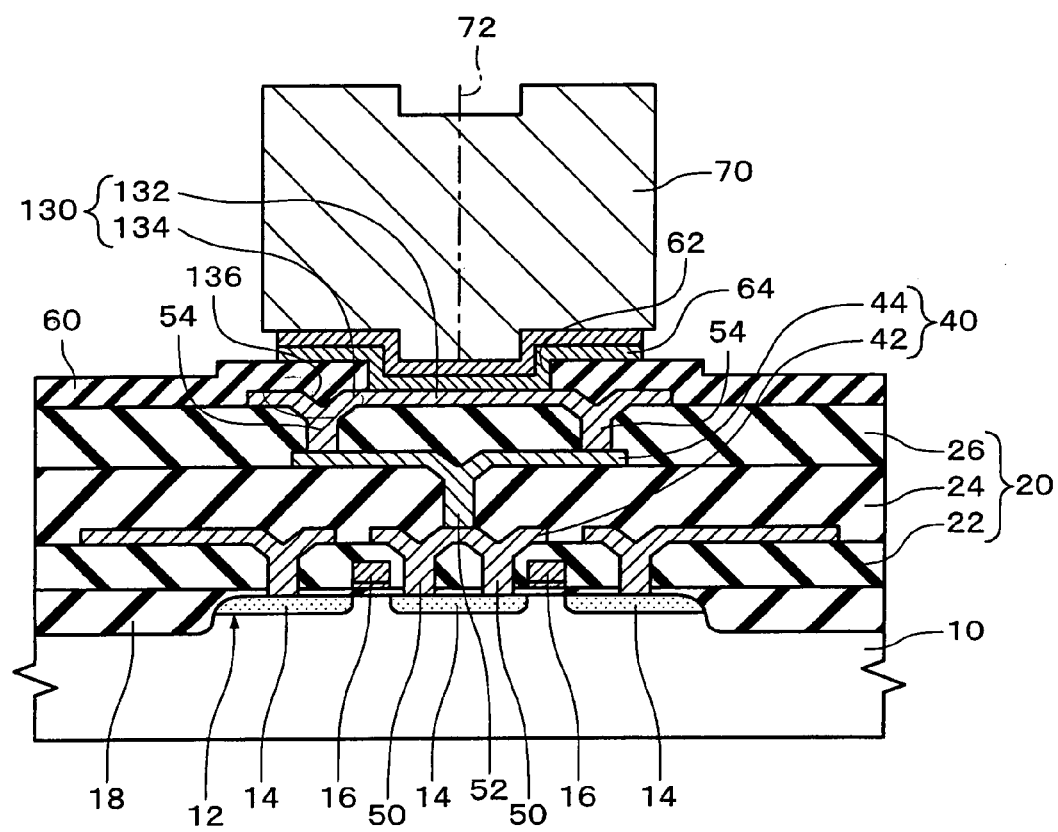
FIG. 3 is a sectional view showing a semiconductor device according to a modification of an embodiment of the invention.

FIG. 3 is a diagram showing the cross section of a semiconductor device according to a modification of this embodiment. In this modification, a depression 136 is formed on the surface of an electrode pad 130 at a position at which the electrode pad 130 overlaps the contact section 54. The depression 136 is formed on a second section 134 of the electrode pad 130 while avoiding a first section 132 of the electrode pad 130. The inner surface of the depression 136 may be tapered to extend in the open direction. The depression may be formed to follow a tapered surface (including flat surface or curved surface) provided to the open end of the contact hole in the insulating layer 20 (third insulating layer 26, for example). In more detail, a contact hole may be formed in the insulating layer 20 (third insulating layer 26, for example) so that the open end is tapered, and a depression may be formed by integrally depositing the contact section 54 and the electrode pad 130 in the contact hole and its peripheral region by sputtering or the like. In this case, the above-described planarization step such as CMP is omitted.

According to this modification, since the contact section 54 is not connected with the first section 132 of the electrode pad 130, even if the thickness of the barrier layer 64 on the second section 134 is decreased to follow the depression 136, diffusion between the electrode pad 130 and the bump 70 can be uniformly prevented since the passivation film 60 is present between the bump 70 and the electrode pad 130. As shown in FIG. 3, a depression may also be formed on the contact sections 50 and 52. Other details of this modification include features which may be derived from the above description.

Figure 4:
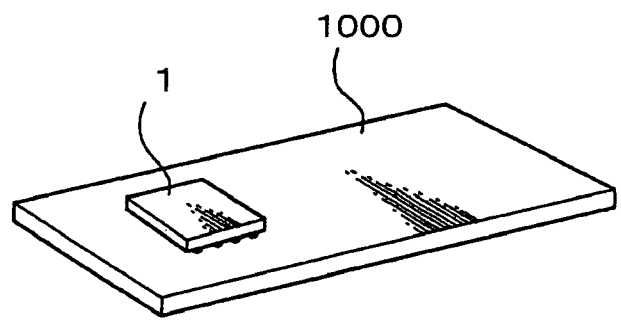
FIG. 4 is a diagram showing a circuit board according to an embodiment of the invention.
Figure 5:
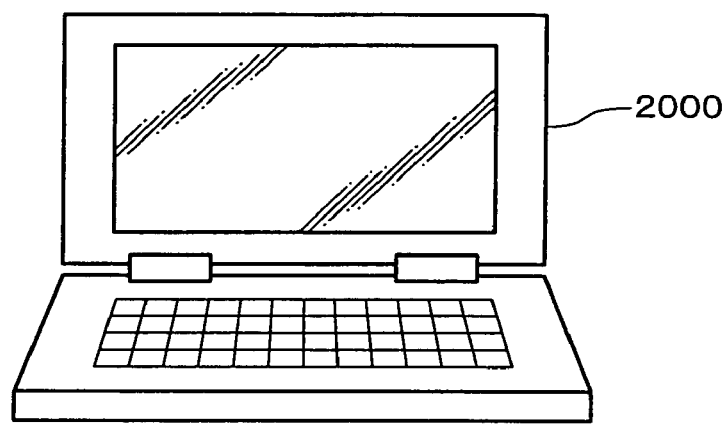
FIG. 5 is a diagram showing an electronic instrument according to an embodiment of the invention.
Figure 6:
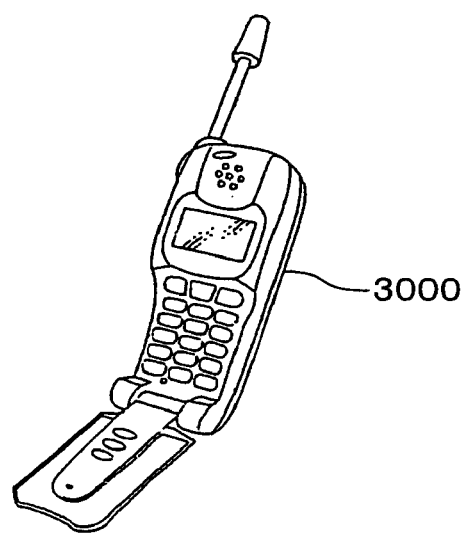
FIG. 6 is a diagram showing another electronic instrument according to an embodiment of the invention.

FIG. 4 shows a circuit board 1000 on which the semiconductor device 1 described in the above embodiment is mounted. FIGS. 5 and 6 respectively show a notebook-type personal computer 2000 and a portable telephone 3000 as electronic instruments including the semiconductor device 1.

The invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. For example, the element type is not limited to a transistor, and includes a diffused resistor, diode, thyristor, capacitor, and the like. For example, the invention includes the case where an element is not be formed under the electrode pad and only an interconnect is formed. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the present invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A semiconductor device, comprising:
   a semiconductor substrate that has a diffusion region;
   an interconnect pattern that is formed above the semiconductor substrate, the interconnect pattern being electrically connected to the diffusion region via a first conductive material, the first conductive material being formed under the interconnect pattern;
   an insulating layer that is formed on the interconnect pattern;
   an electrode pad that is formed on the insulating layer, the electrode pad having a first section and a second section;
   a plurality of second conductive materials that are formed between the interconnect pattern and the electrode pad, the plurality of second conductive materials electrically connecting the interconnect pattern and the electrode pad;
   an insulating film that has a first portion and a second portion, the insulating film being formed such that the first portion of the insulating film is formed on the insulating layer and the second portion of the insulating film is formed on the second section of the electrode pad;
   a bump that is formed above the first section of the electrode pad and the second portion of the insulating film; and
   a metal layer that lies between the electrode pad and the bump, the plurality of second conductive materials being connected with the second section of the electrode pad at a position within a range in which the plurality of the second conductive materials overlap the bump while avoiding the first section of the electrode pad,
   the plurality of the second conductive materials having a third conductive material and a fourth conductive material, the third conductive material being symmetrical with respect to the fourth conductive material around a center axis of the bump.

2. The semiconductor device as defined in claim 1, the bump overlapping the diffusion region.

3. The semiconductor device as defined in claim 1, further comprising:
   an element that is formed in the semiconductor substrate, the element having the diffusion region,
   the bump overlapping the element.

4. The semiconductor device as defined in claim 1,
   a part of the metal layer being formed on the insulating film, and
   the insulating film and the metal layer lying between the second section of the electrode pad and the bump.

5. The semiconductor device as defined in claim 1,
   the electrode pad having a plurality of depressions, each of the plurality of depressions overlapping each of the plurality of second conductive materials.

6. The semiconductor device as defined in claim 1,
   the third conductive material being point-symmetrical with respect to the fourth conductive material around one point of the center axis of the bump.

7. The semiconductor device as defined in claim 1,
   the third conductive material being line-symmetrical with respect to the fourth conductive material around the center axis of the bump.

8. The semiconductor device as defined in claim 1,
   the third conductive material being plane-symmetrical with respect to the fourth conductive material around a plane including the center axis of the bump.

9. The semiconductor device as defined in claim 1,
   the interconnect pattern having a depression, the depression overlapping the first conductive material.

10. A circuit board comprising the semiconductor device as defined in claim 1.

11. An electronic instrument comprising the semiconductor device as defined in claim 1.

12. The semiconductor device as defined in claim 1,
    the insulating layer having a plurality of holes, and
    the plurality of second conductive materials being formed in a plurality of holes, respectively.

* * * * *